United States Patent
Maass

[11] Patent Number: 6,066,951
[45] Date of Patent: May 23, 2000

[54] EXTERNAL LIGHT TESTER

[75] Inventor: Michael Maass, Ypsilanti, Mich.

[73] Assignee: Lear Automotive Dearborn, Inc., Southfield, Mich.

[21] Appl. No.: 09/097,112

[22] Filed: Jun. 12, 1998

[51] Int. Cl.[7] .......................... G01R 31/44; B60Q 11/00; H05B 37/03
[52] U.S. Cl. .................. 324/414; 324/403; 324/500; 324/537; 340/425.5; 340/458
[58] Field of Search ..................... 324/403, 414, 324/500, 503, 537, 555, 556; 340/425.5, 458, 468, 475, 478, 479; 362/460, 464

[56] References Cited

U.S. PATENT DOCUMENTS

| | | | |
|---|---|---|---|
| 5,818,331 | 10/1998 | Rabinovich et al. | 340/458 |
| 5,828,298 | 10/1998 | Eagan | 340/458 |
| 5,900,803 | 5/1999 | Politz et al. | 340/425.5 |

*Primary Examiner*—Glenn W. Brown
*Attorney, Agent, or Firm*—Brooks & Kushman, P.C.

[57] ABSTRACT

An apparatus for testing the exterior lights on a vehicle includes a controller supported by the vehicle and adapted to turn on the exterior lights in response to an actuation signal. A remote control device is adapted to provide the actuation signal from outside the vehicle. A method is also provided for testing the exterior lights including using the remote control device from outside the vehicle to direct the controller to turn on some or all of the exterior lights.

15 Claims, 1 Drawing Sheet

EXTERNAL LIGHT TESTER

BACKGROUND OF THE INVENTION

This invention relates to a method and apparatus for testing the external lights on a vehicle.

Automobiles have numerous external lights which perform various functions. For example, headlights illuminate the road surface for a driver and indicate to pedestrians or other drivers that the car is approaching. Other lights provide visual indicators of the action or intended action of the vehicle, such as brake lights, reverse indicator lights and turn signal lights. A license plate light can also be provided for illuminating the license plate at night. Each type of light includes one or more bulbs which have a limited life.

To determine whether the lights are in working order, the vehicle must either be provided with an expensive computer display which senses when a bulb is burned out or the driver must manually inspect the lights. If the driver can obtain assistance from another person, the driver can leave the car running and turn on the various light in sequence while the assistant verifies that the lights are working. If the driver does not have an assistant, the driver must enter the vehicle, actuate as many lights a possible, exits the vehicle and inspect the lights, re-enter the vehicle and actuate additional lights, and exit the vehicle again and inspect those lights. Unfortunately, many of the lights cannot be actuated simultaneously, such as the high beam and low beam headlights. Further, many of the lights are difficult to actuate if the driver is not in the vehicle, such as brake lights and reverse indicator lights. Therefore, it can be very difficult for a driver, without assistance, to verify that all of the exterior lights on the vehicle are in working order.

SUMMARY OF THE INVENTION

The present invention is directed to providing an apparatus for testing the operation of exterior vehicular lights. In one main aspect of this invention, the testing apparatus includes a controller supported by the vehicle and adapted to turn on the exterior lights in response to a signal initiated by a user. The signal is provided by a signal generator which allows the user to turn on, and inspect, the exterior lights of the vehicle to ensure that they are in working order.

In other features of the invention, the signal generator comprises a remote control device such as those used to active the locks and alarm of most cars. By pressing one of more buttons on the remote control in a particular sequence, the signal can be generated to actuate the exterior lights of the vehicle. The lights can be turned on all at once or in a predetermined sequence.

In another main aspect of the invention, a method is provided for testing the operation of the exterior lights on the vehicle. The method includes initiating an actuation signal to direct a controller to turn on two or more of the following groups of exterior lights: headlights, turn signal lights, reverse indicator lights, and brake lights. A signal generator is actuated from outside the vehicle to provide the actuation signal for the controller.

These and other features of the present invention can best be understood from the following specification and drawings.

DETAILED DESCRIPTION OF THE OF A PREFERRED EMBODIMENT

Figure 1:
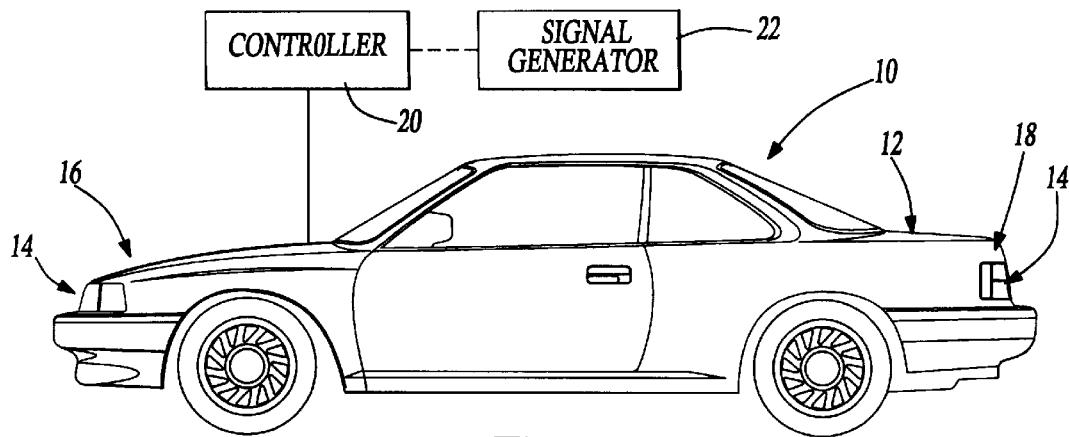
FIG. 1 is a side view of a vehicle including a schematic representation of a controller and a signal generator.

The present invention is generally shown at 10 in FIG. 1 and includes a vehicle 12 having a plurality of exterior lights 14 at both the front 16 and rear 18 of the vehicle 12. A controller 20 is supported by the vehicle 12 and is adapted to turn on all of the exterior lights 14 in response to an actuation signal initiated by a user. A signal generator 22 is provided which is actuatable from outside the vehicle 12 and is adapted to provide the actuation signal.

Figure 2:
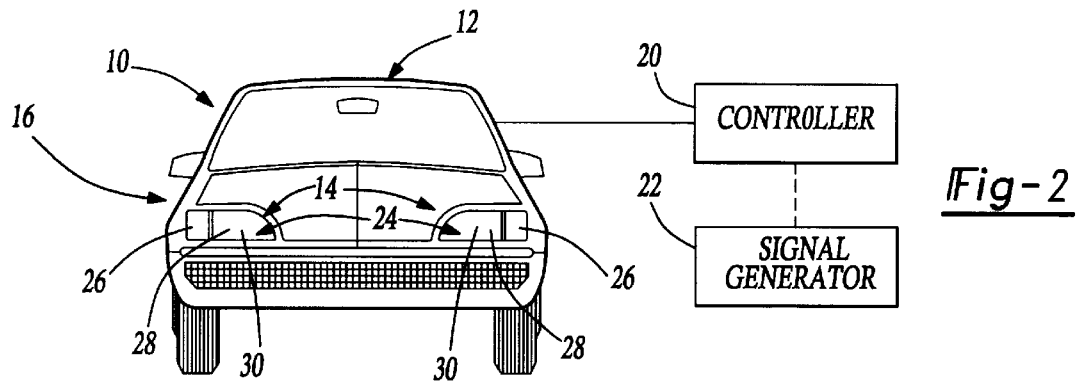
FIG. 2 is a front view of the vehicle illustrating the front exterior lights on the vehicle.

As shown in FIG. 2, the front 16 of the vehicle 12 includes various types of exterior lights 14. Specifically, headlights 24 are provided on opposing sides of the vehicle 12 and are located next to front turn signal lights 26. The headlights 24 include integrated, but separately actuatable, highbeam lamps 28 and lowbeam lamps 30. The present invention also applies to other embodiments (not shown) in which the highbeam lamps 28 and lowbeam lamps 30 are separate.

Figure 3:
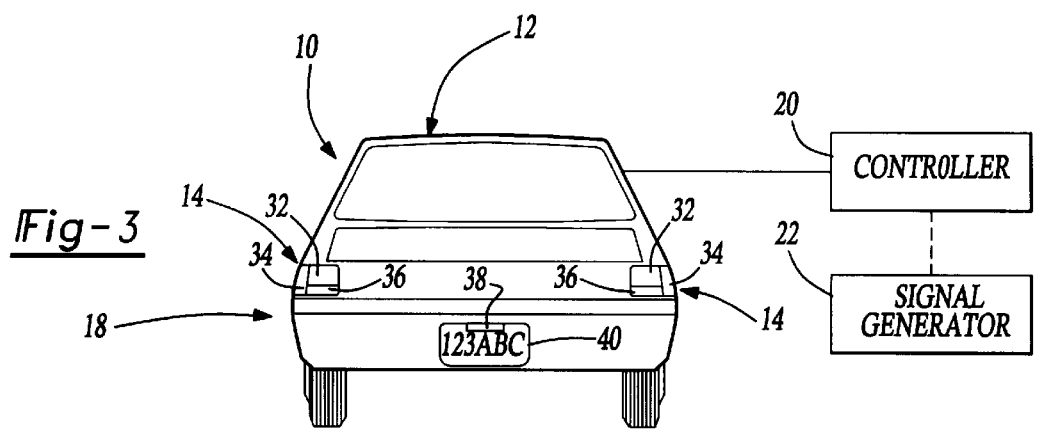
FIG. 3 is a rear view of the vehicle illustration the rear exterior lights on the vehicle.

As shown in FIG. 3, the rear 18 of the vehicle 12 also includes numerous type of exterior lights 14. Specifically, brake lights 32 are included on opposing sides of the vehicle 12 and are located next to rear turn signal lights 34. The present invention also applies to other embodiments in which the rear turn signal lights 34 and brake lights 32 are contained within a single light housing (not shown) while remaining separately actuatable. As shown in FIG. 3, the vehicle 12 also includes reverse indicator lights 36 which are turned on when the vehicle transmission is placed in a reverse setting. Further, at least one license plate light 38 is provided for illuminating the license plate 40 at night.

Figure 4:
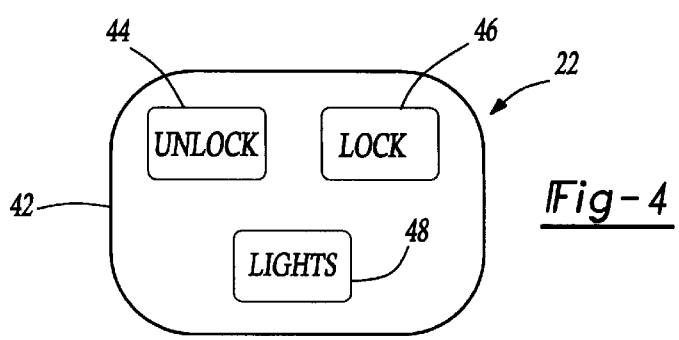
FIG. 4 illustrates one embodiment of a remote control for use with the present invention.

As shown in FIG. 4, the signal generator 22 comprises a remote control 42 of the type typically used to remotely actuate the locks on a car, to set a car alarm, to open the trunk, to sound the horn, or even to remotely start the vehicle 12. The remote control 42 shown in FIG. 4 is a simplified version of such a control and includes an unlock button 44 to unlock the vehicle, a lock button 46 to lock the vehicle, and a lights button 48. Upon pressing the lights button 48, the remote control 42 generates a signal which is received by the controller 20. Upon receipt of the signal, the controller 20 turns on the exterior lights 14 to enable the user to inspect the lights 14 and ensure that all are operational.

Obviously, the particular configuration of the remote control 42 is not central to the operation of the invention as would be understood by a person of ordinary skill in this art. Further, an external button or switch on the vehicle 12 could be used to initiate the actuation signal for the controller 20. For example, many automobiles include a keyless entry keypad (not shown) on the vehicle door. By pressing one or more buttons on such keypad, the exterior lights 14 could be activated.

The present invention also provides a method for testing the operation of the exterior lights 14 on the vehicle 12. In operation, the remote control 42 is actuated to generate a signal received by the controller 20. The signal directs the controller 20 to turn on two or more of the following groups of exterior lights 14: the headlights 24, front turn signal lights 26, rear turn signal lights 34, reverse indicator lights 36, brake lights 32, and license plate light 38. The remote control 42 is operated from outside the vehicle 12 by pressing the lights button 48 to provide the actuation signal for the controller 20. Alternatively, the remote control 42 could be operated from within the vehicle 12. Although a separate lights button 48 can be provided as shown in FIG. 4, the actuation signal can also be generated by pressing other buttons multiple times or in a predetermined sequence to eliminate the need for the separate lights button 48.

Upon receiving the actuation signal, the controller 20 will actuate the exterior lights 14 in predetermined sequence. The exterior lights 14 can either be turned on all at once, sequentially beginning with all of the lights 14 at the front 16 of the vehicle 12 followed by all of the lights 14 at the rear 18 of the vehicle 12, or sequentially with each type of exterior light 14 being turned on individually. The lights 14 are preferably turned on in response to a single actuation signal sent by the remote control 42. If necessary, however, multiple signals can be sent from the remote control 42 to allow a user to selectively operate, for example, only those lights 14 that are currently being inspected.

The controls necessary to achieve this invention are well within the skill of a worker in this art, given the foregoing disclosure. It is the specific application of a light testing control at method which is inventive here.

A preferred embodiment of this invention has been disclosed. However, a person of ordinary skill in the art would recognize that certain modifications come within the scope of this invention. For that reason, the following claims should be studied to determine the true scope and content of this invention.

What is claimed is:

1. An apparatus for testing the operation of vehicular lights, said apparatus including:

a vehicle;

said vehicle including a plurality of exterior lights;

said exterior lights including brake lights, headlights, turn signal lights, and reverse indicator lights;

a controller supported by said vehicle and adapted to turn on a plurality of said exterior lights in response to an actuation signal initiated by a user; and a signal generator actuatable from outside said vehicle and adapted to provide said actuation signal.

2. The apparatus of claim 1 wherein said signal generator comprises a remote control device including at least one button.

3. The apparatus of claim 1 wherein said controller is adapted to turn on said some of said exterior lights at a separate interval from other of said exterior lights.

4. The apparatus of claim 1 wherein said controller is adapted to turn on all of said exterior lights in response to a single actuation signal initiated by the user.

5. The apparatus of claim 1 wherein said controller is adapted to operate when said vehicle is turned off.

6. A method for testing the operation of exterior lights on a vehicle, said method comprising:

initiating an actuation signal to direct a controller to turn on two or more of the following groups of exterior lights: headlights, turn signal lights, reverse indicator lights, and brake lights; and actuating a remote control device from outside the vehicle to provide the actuation signal.

7. The method of claim 6 further comprising pressing a button on the remote control device to initiate the actuation signal.

8. The method of claim 6 further comprising pressing one or more buttons on the remote control device in a predetermined sequence to initiate the actuation signal.

9. The method of claim 6 further comprising turning on some of the exterior lights at a separate interval from other of the exterior lights.

10. The method of claim 6 further comprising turning on all of the exterior lights in response to a single actuation signal.

11. An apparatus for testing the operation of vehicular lights, said apparatus including:

a vehicle;

said vehicle including a plurality of exterior lights;

said exterior lights including the following types of lights: headlights, turn signal lights, reverse indicator lights, and brake lights;

a controller supported by said vehicle and adapted to turn on two or more of said types of said exterior lights in response to a single actuation signal initiated by a user;

a signal generator adapted to provide said actuation signal; and said signal generator including a switch adapted to permit a user to selectively initiate said actuation signal whereby the user can inspect the operation of said exterior lights.

12. The apparatus of claim 11 wherein said signal generator is actuatable from outside said vehicle.

13. The apparatus of claim 11 wherein said signal generator comprises a remote control device and said switch comprises at least one button on said remote control device.

14. The apparatus of claim 11 wherein said controller is adapted to turn on some of said exterior lights at a separate interval from other of said exterior lights.

15. The apparatus of claim 11 wherein said controller is adapted to turn on all of said exterior lights in response to a single actuation signal initiated by the user.

* * * * *